United States Patent
Calabro et al.

(10) Patent No.: US 12,476,651 B2
(45) Date of Patent: Nov. 18, 2025

(54) SINGLE ENDED CONVERSIONS ON A TRUE DIFFERENTIAL ANALOG TO DIGITAL CONVERTER (ADC)

(71) Applicant: Infineon Technologies Austria AG, Villach (AT)

(72) Inventors: Rocco Calabro, Arnoldstein (AT); Alan Paussa, Villach (AT)

(73) Assignee: Infineon Technologies Austria AG, Villach (AT)

( * ) Notice: Subject to any disclaimer, the term of this patent is extended or adjusted under 35 U.S.C. 154(b) by 146 days.

(21) Appl. No.: 18/479,425

(22) Filed: Oct. 2, 2023

(65) Prior Publication Data

US 2025/0112641 A1    Apr. 3, 2025

(51) Int. Cl.
H03M 1/00        (2006.01)
H03M 1/46        (2006.01)

(52) U.S. Cl.
CPC .................................. H03M 1/466 (2013.01)

(58) Field of Classification Search
CPC ........ H03M 1/38; H03M 1/468; H03M 1/002; H03M 1/1009; H03M 1/462; H03M 1/1014; H03M 1/12; H03M 1/1245; H03M 1/466; H03M 1/804; H03M 1/00; H03M 1/06; H03M 1/0609; H03M 1/1028; H03M 1/1042; H03M 1/1047; H03M 1/124; H03M 1/144; H03M 1/164; H03M 1/188; H03M 1/46; H03M 1/56; H03M 1/68
USPC .................................. 341/139, 155, 161, 172
See application file for complete search history.

(56) References Cited

U.S. PATENT DOCUMENTS

| | | | |
|---|---|---|---|
| 7,161,520 B2* | 1/2007 | Liu ........................ | H03M 3/34 341/172 |
| 9,013,442 B2* | 4/2015 | Hotelling ............ | G06F 3/04166 345/173 |
| 10,447,291 B1* | 10/2019 | Thomas .............. | H03M 1/1245 |
| 10,862,498 B1* | 12/2020 | Chen ................... | H03M 1/1033 |
| 12,224,765 B1* | 2/2025 | Seow ................... | H03M 1/468 |
| 12,261,621 B2* | 3/2025 | Sedighi ................ | H03M 1/462 |
| 2007/0236380 A1* | 10/2007 | La Rue ............... | H03M 1/1245 341/155 |
| 2015/0372691 A1* | 12/2015 | Mandal ................ | H03M 1/38 341/110 |

(Continued)

OTHER PUBLICATIONS

"Successive Approximation type ADC", Basic Electronics Tutorials, Retrieved from: https://www.electronics-tutorial.net/analog-integrated-circuits/data-converters/successive-approximation-type-adc/, Accessed on: Jun. 26, 2023, 2 pp.

(Continued)

*Primary Examiner* — Linh V Nguyen
(74) *Attorney, Agent, or Firm* — Shumaker & Sieffert, P.A.

(57) ABSTRACT

This disclosure describes analog to digital converter (ADC) circuitry configured to receive either a differential input signal or a single-ended (SE) input signal and output a digital representation of the input signal using the full-scale of the ADC output. The ADC circuitry of this disclosure includes a true differential ADC that, when receiving a SE input signal is configured to make two adjustments to the ADC characteristic. One adjustment is to shift the ADC characteristic by the reference voltage of the ADC, e.g., Varef. The second adjustment is to multiply the input signal by two, e.g., to double the input signal magnitude.

20 Claims, 7 Drawing Sheets

(56) References Cited

U.S. PATENT DOCUMENTS

2020/0274546 A1* 8/2020 Kim ............... H03M 1/466
2021/0119638 A1* 4/2021 Ghosh ............ H03M 1/164
2021/0376850 A1* 12/2021 Mudegowdar ...... H03M 1/001

OTHER PUBLICATIONS

"Successive-Approximation ADC", ECStudio, Retrieved from: https://ecstudiosystems.com/discover/textbooks/basic-electronics/ad-and-da-converters/successive-approximation-adc/, Accessed on: Jun. 26, 2023, 2 pp.
DAS, "How does Successive Approximation (SAR) ADC Work and Where is it best used?", Circuit Digest, Oct. 30, 2020, 4 pp.
Smith, "Understanding the Successive Approximation Register ADC", All About Circuits, Dec. 28, 2015, 5 pp.

* cited by examiner

SINGLE ENDED CONVERSIONS ON A TRUE DIFFERENTIAL ANALOG TO DIGITAL CONVERTER (ADC)

TECHNICAL FIELD

The disclosure relates circuitry for analog to digital conversion.

BACKGROUND

Analog to digital conversion circuitry is configured to receive an analog signal and output a digital representation of the received signal. The resolution of the analog to digital conversion circuitry depends on the number of output bits, with more output bits delivering higher resolution, e.g., closer in value to the analog signal, compared with fewer output bits. Some example types of analog to digital converter (ADC) circuitry may include flash or direct type ADCs, delta-sigma, and successive approximation register (SAR). Some examples of ADC circuitry may be differential, where the ADC output is based on the difference between two input signals. Other example ADC circuitry may include single ended (SE), also called unipolar, in which an input voltage is compared to a reference voltage, such as ground.

SUMMARY

In general, the disclosure describes analog to digital converter (ADC) circuitry configured to receive either a differential input signal or a single-ended (SE) input signal and output a digital representation of the input signal using the full-scale of the ADC output. The ADC circuitry of this disclosure includes a true differential ADC that, when receiving a SE input signal is configured to make two adjustments to the ADC characteristic. One adjustment is to shift the ADC characteristic by the reference voltage of the ADC, e.g., Varef. The second adjustment is to multiply the input signal by two, e.g., to double the input signal magnitude.

In one example, the disclosure describes an ADC circuit, the circuit comprising a first input terminal and a second input terminal, and circuitry configured to receive an analog signal comprising a voltage at the first input terminal and the second input terminal, shift the received analog signal by a reference voltage of the ADC circuit, double the received analog signal, and based on the shifted and doubled received analog signal, output a digital value that approximates the voltage of the analog signal.

In another example, the disclosure describes a method comprising receiving an analog signal comprising a voltage magnitude at a first input terminal and a second input terminal of an ADC circuit, shifting the received analog signal by a reference voltage of the ADC circuit; doubling the received analog signal, and outputting a digital value that approximates the voltage magnitude of the analog signal.

In another example, the disclosure describes an ADC circuit, the circuit comprising a first input terminal and a second input terminal, and circuitry configured to receive an analog signal comprising a voltage magnitude at the first input terminal and the second input terminal; in response to the received analog signal being a single-ended analog signal, sample the received analog signal shift it by a reference voltage of the ADC circuit; doubling the received analog signal by halving the reference voltage during the conversion phase; and output a digital value that approximates the voltage magnitude of the analog signal.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes analog to digital converter (ADC) circuitry configured to receive either a differential input signal or a single-ended (SE) input signal and output a digital representation of the input signal using the full-scale of the ADC output. Some sensing application may benefit the conversion to digital of both single ended (SE) and differential (DIFF) analog voltage signals. Natively a SE ADC is not able to sense a DIFF signal correctly. Similarly a DIFF ADC is not able to sense a SE signal correctly. However, a true differential (TD) ADC may allow the sensing of SE and DIFF signals, but the SE signals would be limited to half of the ADC characteristic. The ADC circuitry of this disclosure is configured to perform both DIFF sensing and to perform full-scale SE sensing by using a modified version of a TD switched capacitor SAR ADC.

The ADC circuitry of this disclosure includes a true differential ADC that, when receiving a SE input signal is configured to make two adjustments to the ADC characteristic. In some examples, the first adjustment is to shift the ADC characteristic by the reference voltage of the ADC, e.g., Varef. The second adjustment is to multiply the input signal by two, e.g., to double the input signal magnitude. In this manner, a SE signal may be converted to a digital signal using the full scale of the TD ADC. Because the magnitude of the shift depends on the digital word set during the sampling, in other examples, the shift may be programmed from zero to the reference voltage, Varef.

Figure 1B:
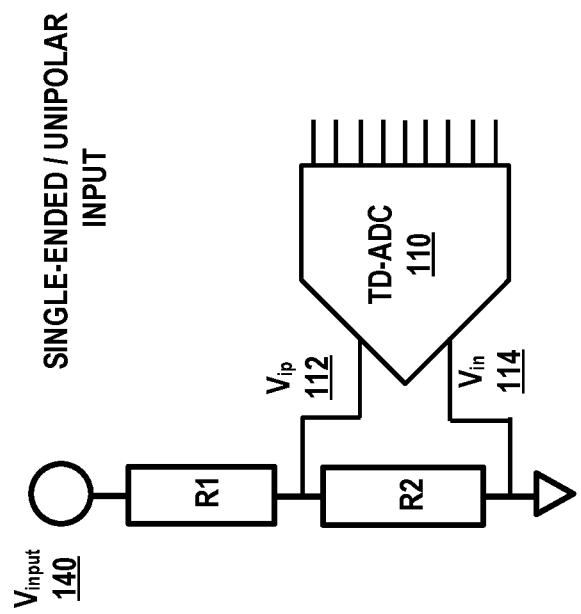
FIG. 1B is a schematic diagram illustrating an ADC receiving a single-ended input analog signal.
Figure 1A:
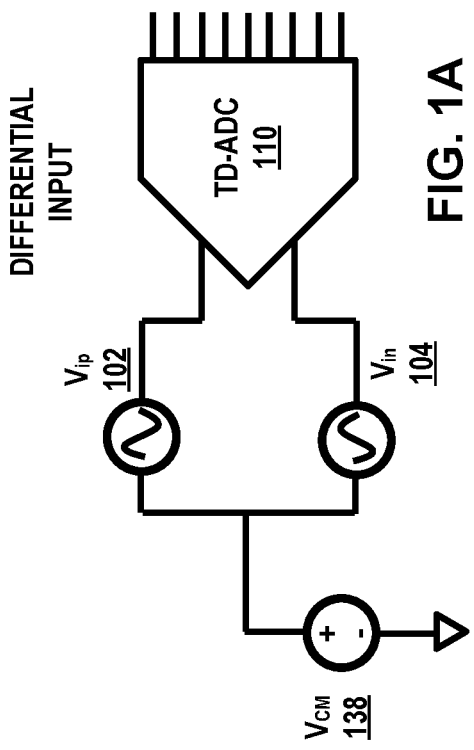
FIG. 1A is a schematic diagram illustrating an ADC receiving a differential input analog signal.

FIGS. 1A and 1B are a schematic diagrams illustrating examples of a differential input TD-ADC and a single ended input to a TD-ADC. In the example of FIG. 1A, TD-ADC 110 may receive a first input at a first terminal from Vip 102 and a second input at a second terminal from Vin 104. The common mode voltage is modeled as Vcm 138 and connects to both the first terminal and the second terminal.

In the example of FIG. 1B, the same TD-ADC 110 may be configured to receive a single ended input. In FIG. 1B, Vin 114 connects to ground and Vip 112 connects to Vinput 140 through resistor R1. Resistor R1 and resistor R2 form a voltage divider.

The TD ADC circuitry of this disclosure may provide advantages over other implementations of an ADC. Currently, if a system should use both SE and differential conversion there are several ways to do so, different from the TD ADC of this disclosure. For example, use two types of ADCs, one SE and one DIFF, with the following disadvantages: such as system needs to develop two complete ADCs, consuming more circuit area, additional power consumption and an increased complexity of the overall system. In another example, the ADC circuit could convert the SE signal to DIFF and use a DIFF ADC, with the following disadvantages: introduction of additional errors to the sampled signal, potentially additional power consumption, and circuit area impact. In another example, the ADC circuit could convert the DIFF signal to SE and use a SE ADC, with the following disadvantages: loss of power supply rejection (PSR) of the ADC and common mode disturbance rejection due to SE operation, introduction of additional errors to the sampled signal, potentially additional power consumption, and circuit area impact. As described above, another technique may include to use a TD ADC without adapting the SE signal with the disadvantage of loss of half the dynamic of the ADC as the SE signal is unipolar.

Figure 2:
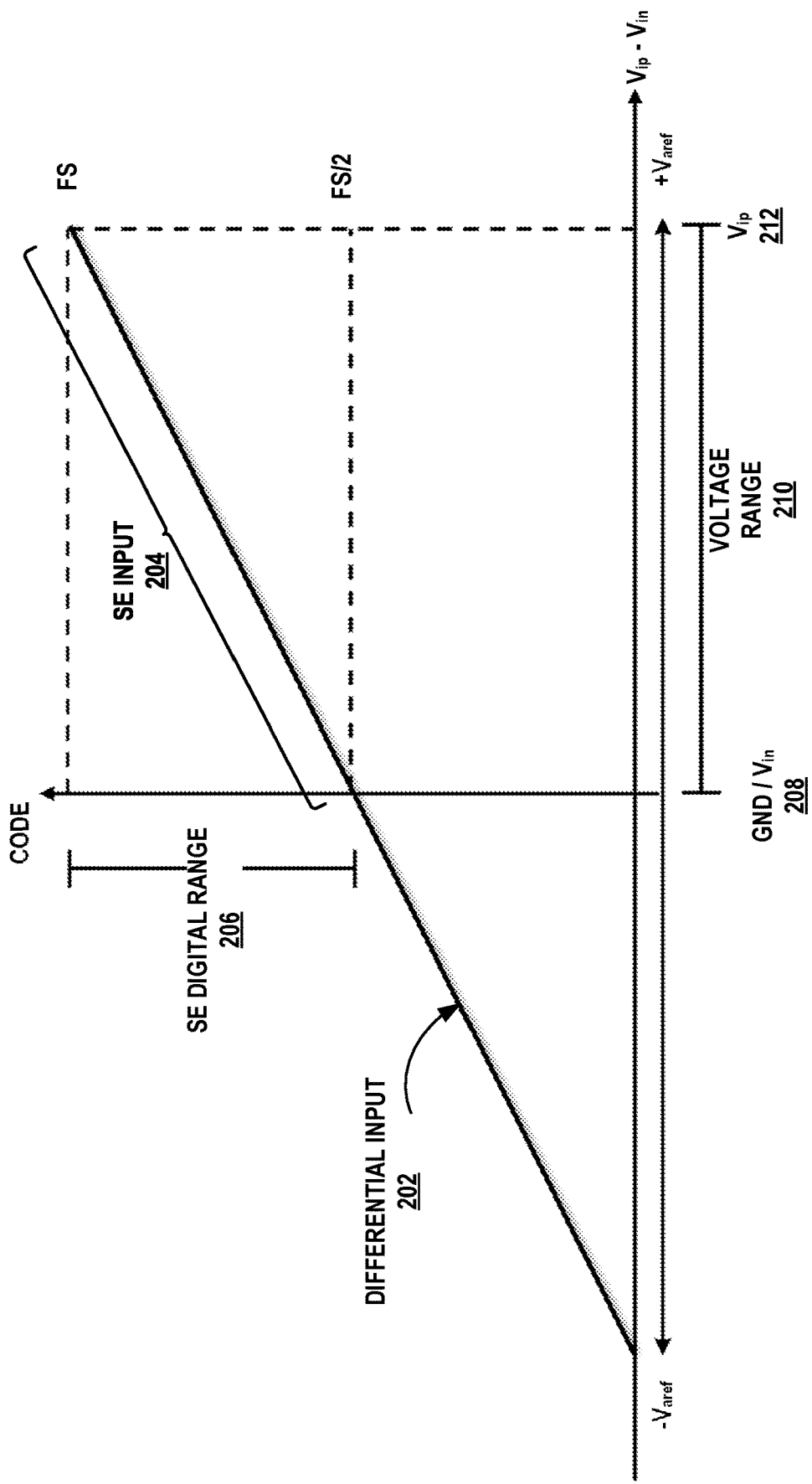
FIG. 2 is a chart illustrating the voltage range and digital range for a true differential ADC receiving a differential input analog signal and receiving a single-ended input analog signal.

FIG. 2 is a chart illustrating the voltage range and digital range for a true differential ADC receiving a differential input analog signal and receiving a single-ended input analog signal. FIG. 2 illustrates differential input 202 that may vary between -Varef to +Varef. The reference voltage, Varef is the magnitude of voltage that will result in a full scale digital output from the ADC. Full scale depends on the number of bits for the ADC, e.g., full-scale for an 8-bit ADC is 255 and for a 12-bit ADC is 4095. Therefore, for differential input 202 a negative value of -Varef will result in an output from the TD ADC of a digital zero, e.g., 0000 0000, for an 8-bit ADC. A differential voltage received by the TD ADC of +Varef will result in a digital output of 255, or 1111 1111 for an 8-bit ADC.

However, a single ended input 204, as described above in relation to FIG. 1B, has a voltage range 210 from ground, or Vin 208 to Vip 212. So the range of digital values 206 for an SE input is half of the full scale, e.g., from FS/2 to FS, in the example of FIG. 2.

Figure 3:
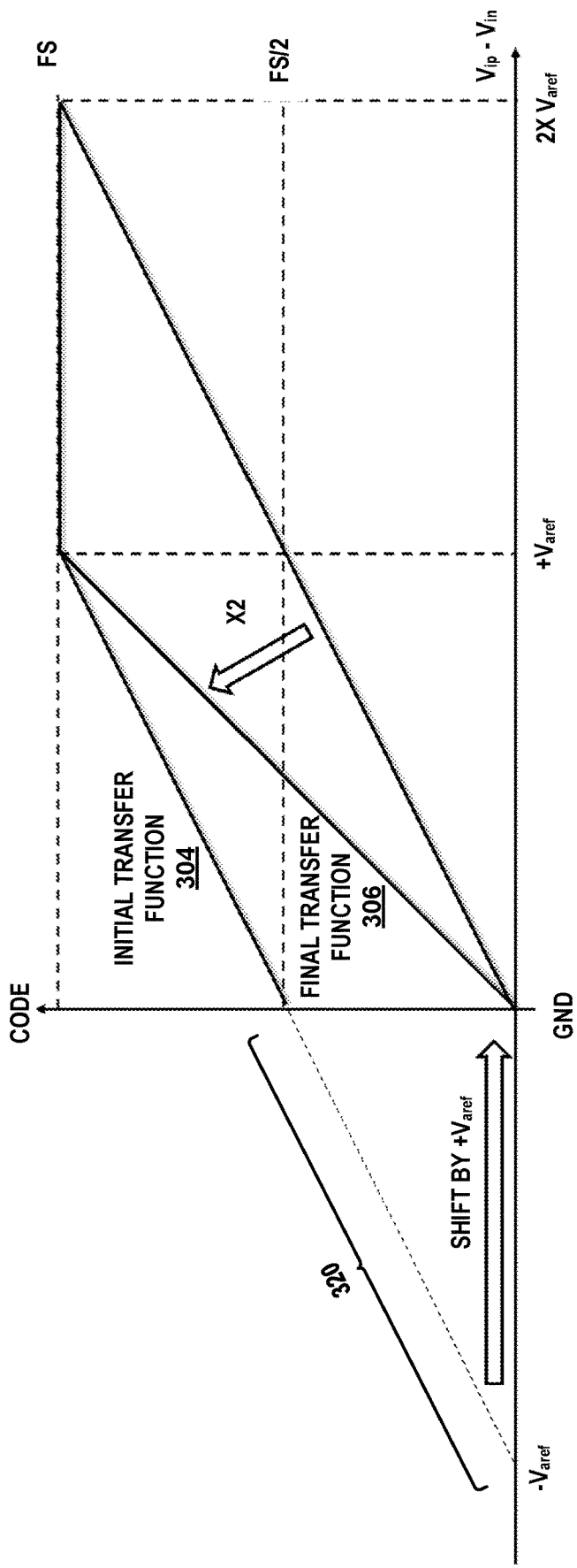
FIG. 3 is a chart illustrating an example implementation of the techniques of this disclosure.

FIG. 3 is a chart illustrating an example implementation of the techniques of this disclosure. The TD ADC of this disclosure helps to resolve the issues described above in relation to FIGS. 1B and 2. In the example of FIG. 3, the initial transfer function 304 for a SE input, e.g., a unipolar input may range in voltage from ground (GND) to +Varef and output digital values from FS/2 to FS. TD ADCs differ from fully differential or differential ADCs as the TD ADC perform a conversion of the input differential signal independently from the common mode of the input signal. This independence feature allows TD ADC to also accept SE signal at the ADC differential input. But, as described above in relation to FIG. 2, because of the unipolar nature of the SE signal, just part of the ADC dynamic range may be used (SE input 204 of FIG. 2 and initial transfer function 304 of FIG. 3) effectively halving the number of quantization steps for the full scale.

To adapt the ADC full-scale digital range to the single ended measurement, the ADC circuitry may include the following equivalent transformations to the input: a voltage shift and a multiplication by two. The successive approximation register (SAR) ADC of this disclosure may include at least one capacitor digital to analog converter (CDAC) for feedback. Shifting by Varef may result in the input voltage range for the TD ADC from ground to twice Varef, and the digital transfer function to use the full-scale of the TD-ADC. Shifting by Varef, may be achieved by sampling with sar_p=0 and sar_n=FS setting of the CDAC. In other examples, the shift may be programmed from zero to the reference voltage, Varef, as described above to set a specified magnitude for the shift.

The TD ADC circuitry of this disclosure may multiply the input signal by two, which results in the final transfer function 306. Final transfer function 306 may output the full-scale for ADC digital values for the SE input voltage range from ground to +Varef. In some examples, the multiplication by two may be achieved by doubling the sampling capacitor. In other examples, the circuit may not include dedicated sampling capacitors. The multiplication factor of two can be given also by different reference voltages used during sampling and redistribution. For example, instead of doubling the capacitance of the sampling capacitors, the circuit may operate by reducing the reference voltage, e.g., Varef, by half during the conversion phase.

In other examples, the TD ADC circuit may shift the received input voltage by an arbitrary value, e.g., by a value less than Varef. The relative capacitance values for the components may be selected to work with the arbitrary shifted voltage value to achieve the shifting and multiplication features of the TD ADC circuit of this disclosure. In other words, an example of the TD ADC circuit may be used to condition the input signal for an arbitrary type of SC SAR ADC where sample capacitor and CDAC are two different entities allowing for an offset-gain adjustment.

Figure 4:
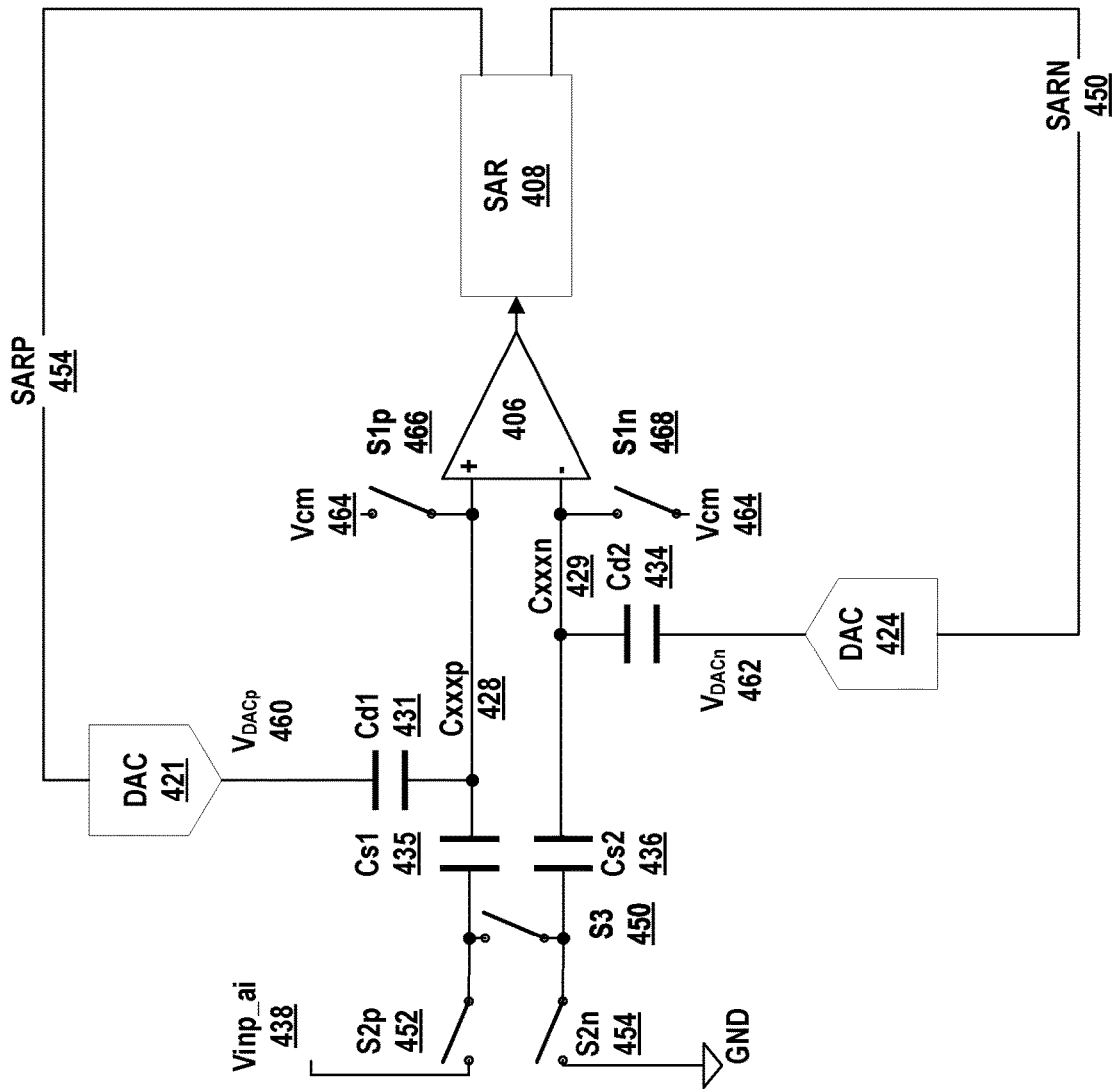
FIG. 4 is a schematic diagram illustrating an example circuit configured to implement the TD ADC of this disclosure.

FIG. 4 is a schematic diagram illustrating an example circuit configured to implement the TD ADC of this disclosure. The circuit in the example of FIG. 4 is configured to implement the shifting and multiplication steps described above in relation to FIG. 3.

In the example of FIG. 4, the two input terminals connect to Vinp_ai 438 and to ground in a single ended configuration. As described above in relation to FIGS. 1A and 1B, in other examples, the TD ADC circuit may connect to differential input so the ground connection at the input terminal would instead connect to another voltage.

Vinp_ai 438 connects to the non-inverting input of comparator 406 through a series arrangement of switch S2p 452 and sampling capacitor Cs1 435. The inverting input of comparator 406 connects to ground through a series connection of sampling capacitor Cs2 436 and switch S2n 454. When closed, switch S3 450 connects capacitor Cs1 435 in series with Cs2 436.

The output of comparator 406 connects to successive approximation register SAR 408. SAR 408 includes a positive SAR output terminal (sar_p), shown as SARP 454 in FIG. 4, and further includes a negative SAR output terminal (sar_n) shown as SARN 450. SARP 454 and SARN 450 are digital outputs. SARP 454 connects to DAC 421 and SARN 450 connects to DAC 424. In some examples DAC 421 and DAC 424 are implemented as CDACs. The output of DAC 421 connects to the non-inverting input of 406 through CDAC capacitor Cd1 431. The output of DAC 424 connects to the inverting input of 406 through CDAC capacitor Cd2 434. In the example of FIG. 4, the node that connects to the non-inverting input of 406 is Cxxxp 428 and the node that connects to the inverting input of 406 is Cxxxn 429. Cxxxp 428 and Cxxxn 429 may also be connected to the common mode voltage Vc 464 when switches S1p 466 and S1n 468 are closed.

Capacitors Cs1 435, Cs2 436, Cd1 431, and Cd2 434 and switches S2p 452, S2n 454, S3 450, S1p 466 and S1n 468 described above for the TD ADC of FIG. 4 form a switched capacitor circuit connected to the Vinp_ai 438 input terminal and the ground input terminal. The capacitance value for CDAC capacitor Cd1 431 is configured to match the capacitance value for Cd2 434. Similarly the capacitance value for sampling capacitor Cs1 435 is configured to match the capacitance value for Cs2 436. As described above in relation to FIG. 3, to achieve the multiplication by two, in some examples, the capacitance value for Cs1 435 and Cs2 436 may be double the capacitance value of Cd1 431 and Cd2 434. In other examples, the TD ADC of FIG. 4 may achieve the multiplication by adjusting the reference voltages, as described above in relation to FIG. 3.

In some examples, e.g., if the shifting and multiplication steps of this disclosure were NOT followed, a conversion of a SE analog input at the input terminals may operate as follows. Vinp_ai 438 and ground can be sampled at the input terminals on the sampling capacitors Cs1 435 and Cs2 436, with the capacitance of the sampling capacitors approximately equal to the capacitance of CDAC capacitors Cd1 431 and Cd2 434 against Vcm 464. At the same time the sarp and sarn words, SARP 454 and SARN 450 can be set to midscale, which would equivalently sample half of the reference against Vcm to the overall CDAC capacitor on both comparator sides. The reference voltage mentioned (not shown in FIG. 4) at this point is the voltage used by the ADC to compare to its analog input, e.g., Varef described above in relation to FIGS. 2 and 3. The source of this reference voltage could be external to the ADC, could be external to an integrated circuit (IC) on which the TD ADC is implemented, or the reference voltage could be generated internally, e.g. a bandgap voltage reference.

The sample phase finishes once the S1 and S2 switches are open, where the S1 switches include S1p 466 and S1n 468, while the S2 switches include S2p 452 and S2n 454. The conversion phase starts by closing the switch S3 450 and running the SAR algorithm through the CDACs, e.g., DAC 421 and DAC 424 given the output of comparator 406 at each decision cycle.

In this manner, if Vinp_ai 438 is equal to the reference ground, e.g., zero volts, the first decision of the comparator will be either 1 or 0 depending on any noise in the circuit. When Vinp_ai 438 is equal to the reference ground, the voltage at the input terminals are approximately equal. If the first decision by comparator 406 is 1, the SAR loop will work to cancel the effect of this decision resulting in a digital output of FS/2 at the output of the ADC and the opposite would happen if the first decision is a zero. This is expected, as can be appreciated by the initial transfer function line 304 described above in relation to FIG. 3.

Figure 5A:
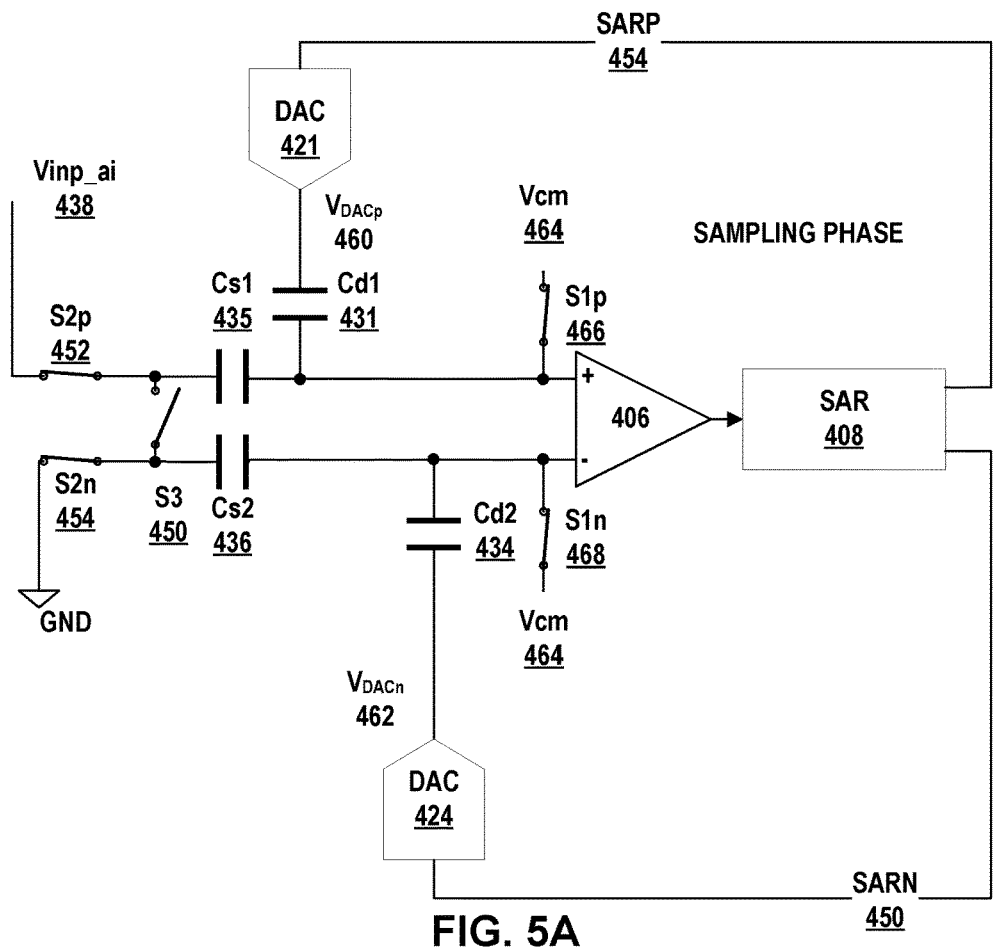
FIG. 5A is a schematic diagram illustrating the TD ADC of this disclosure during the sampling phase.
Figure 5B:
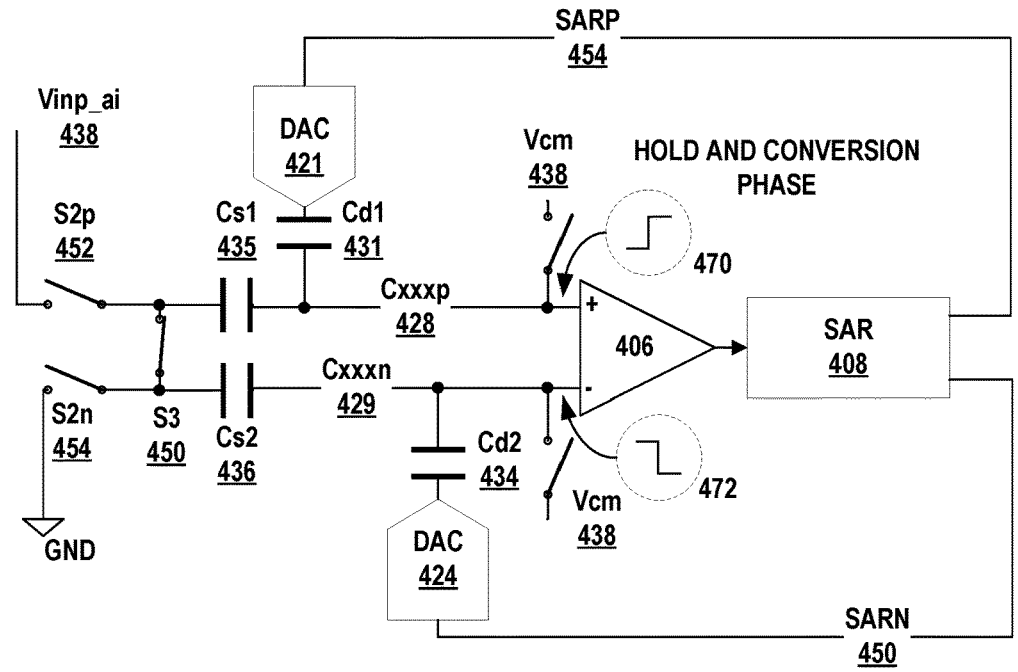
FIG. 5B is a schematic diagram illustrating the TD ADC of this disclosure during the holding and conversion phase.

FIGS. 5A and 5B are schematic diagrams illustrating the operation of the TD ADC implementing the shifting and multiplication steps of this disclosure. The components names, reference numbers, characteristics and function are the same as described above in relation to FIG. 4. Similar to the description of FIG. 4, FIG. 5A is a schematic diagram illustrating the TD ADC of this disclosure during the sampling phase. The application of the circuit operation of this disclosure affects two aspects of the analog to digital conversion. In some examples, the sampling capacitors are doubled compared to the CDAC capacitors to implement gain doubling. Also, as described above in relation to FIG. 3, the DAC setting is modified during the sample phase to implement the characteristic shift of the received analog signal by the reference voltage, e.g., Varef of FIGS. 2 and 3.

In some examples, a SE conversion according to the steps of this disclosure may sample Vinp_ai 438 and ground at the input terminals against Vcm 464 on the sampling capacitors Cs1 435 and Cs2 436, with the capacitance of the sampling capacitors approximately double the capacitance of CDAC capacitors Cd1 431 and Cd2 434, resulting in doubling the analog signal received at the input terminals. At the same time the sarp, SARP 454, may be set to digital zero and the sarn, SARN 450 may be set to FS. This unbalancing of DACs 421 and 424, equivalently samples the digital zero converted to approximately zero volts at $V_{DAC_p}$ 460 against Vcm 464 to DAC 421, e.g., the CDAC on the positive side of comparator 406. The DAC unbalancing also samples digital FS, converted by DAC 424 to the equivalent voltage of Varef, e.g., $V_{DAC_n}$ 462 against Vcm 464 on the negative side of comparator 406. The sample event finishes once the S1 and S2 switches open, as described above in relation to FIG. 4.

FIG. 5B is a schematic diagram illustrating the TD ADC of this disclosure during the holding and conversion phase. The conversion phase starts by closing the switch S3 450, resetting the sarp and sarn words to a digital midscale, and running the SAR algorithm through DACs 421 and 424, based on the output of comparator 406 at each decision cycle. Therefore, in contrast to other techniques, e.g., as described above in relation to FIG. 4, if Vinp_ai 438 is equal to the reference ground at the input terminals, at the start of the conversion phase node cxxxp 428 is "pushed up 470" (e.g., DAC 421 goes from 0 to FS/2) and node cxxxn 429 is "pushed down 472" (e.g., DAC 424 drops from FS to FS/2). The SAR algorithm executed by SAR 408 will try to compensate this by setting all the sarn bits, SARN 450, to digital one during the SAR search process and leaving all the sarp bits, SARP 454, to digital zeros. The result is a converted zero word, as described above for final transfer function 306 in relation to FIG. 3.

In other words, the TD ADC depicted in FIGS. 5A and 5B may output a digital value that approximates the voltage magnitude of the analog signal based on the shifted and doubled received analog signal. The above specific example describes an input analog signal of approximately zero volts, e.g., in which Vinp_ai 438 is approximately equal to ground. In other examples, when Vinp_ai 438 is a non-zero voltage value, the TD ADC may output a digital value that approximates the voltage magnitude of the analog signal according to the final transfer function 306.

Figure 6A:
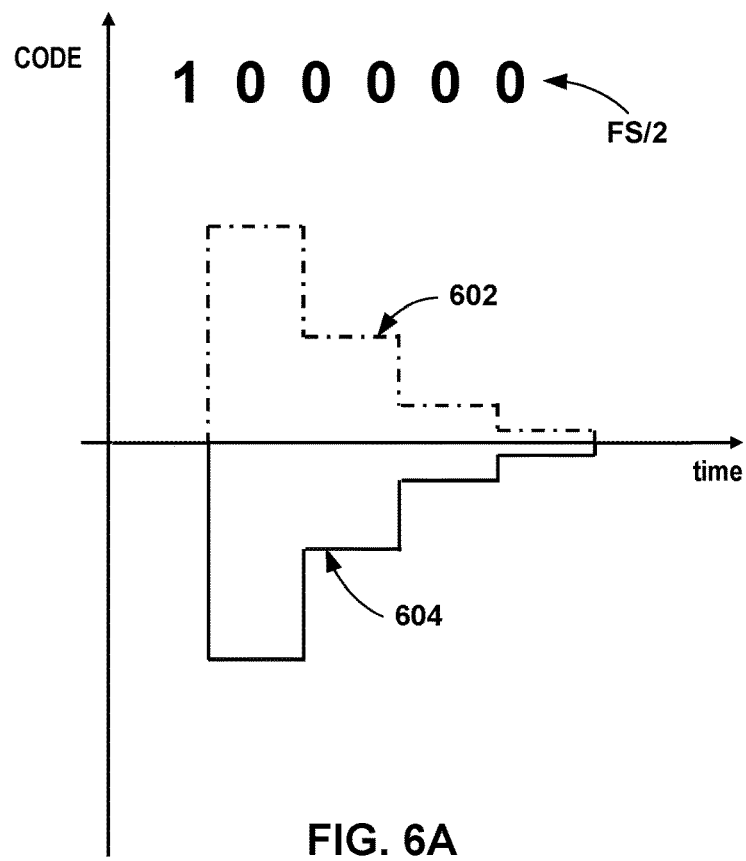
FIG. 6A is a time chart illustrating an example SAR approximation for a single-ended input equal to ground without shifting the ADC transfer function.

FIG. 6A is a time chart illustrating an example SAR approximation for a single-ended input equal to ground without shifting the ADC transfer function. Dashed curve 602 and solid curve 604 represent respectively the positive and negative inputs of the comparator during the conversion phase when the sampled positive ADC input voltage is equal to ground. As described above in relation to FIG. 4, during the conversion phase, closing the switch S3 450, resets the sarp and sarn words to a digital mid-scale, and word stay at midscale during sampling, and first decision of the SAR search, then runs the SAR algorithm through DACs 421 and 424, based on the output of comparator 406 at each decision cycle, as shown in FIG. 6A. When the first decision by comparator 406 is 1, as shown in FIG. 6A, the SAR loop will work to cancel the effect of this decision resulting in a digital output of FS/2 at the output of the ADC.

Figure 6B:
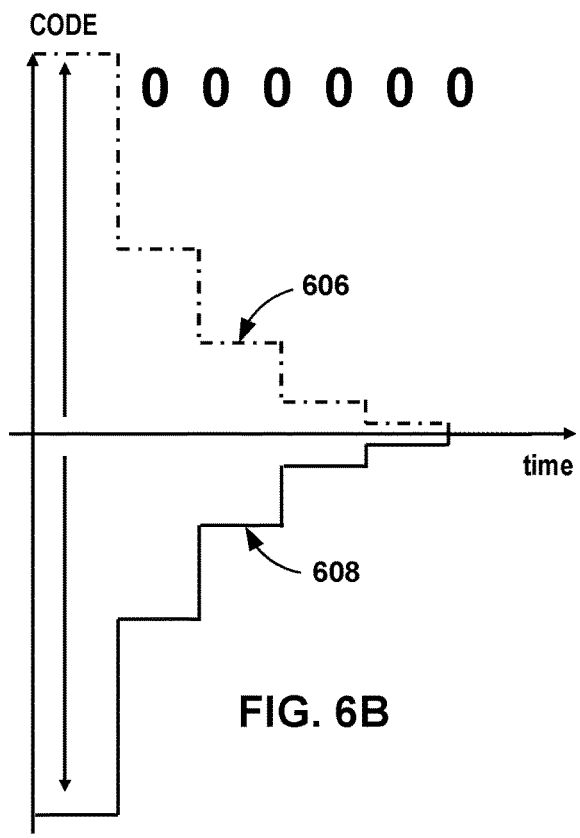
FIG. 6B are charts illustrating an example SAR approximation for a single-ended input equal to ground using the shifted ADC transfer function according to one or more techniques of this disclosure.

FIG. 6B is a chart illustrating an example SAR approximation for a single-ended input equal to ground using the shifted ADC transfer function according to one or more techniques of this disclosure. Dashed curve 606 and solid curve 608 in FIG. 6B represent respectively the positive and negative inputs of the comparator during the conversion phase when the sampled positive ADC input voltage is equal to ground and the proposed method is applied. As described above in relation to FIG. 5B, when Vinp_ai 438 is equal to the reference ground at the input terminals, at the start of the conversion phase DAC 421 goes from zero to FS/2 and DAC 424 goes from FS to FS/2. The SAR algorithm may set SARN 450 to digital full scale during the SAR search process and leaving SARP 454 at digital zeros. The result is a converted zero word, as shown in FIG. 6B.

Figure 6C:
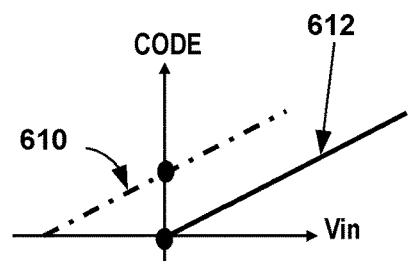
FIG. 6C is a chart illustrating the shifted 612 and not shifted 610 ADC transfer curves.

FIG. 6C is a chart illustrating the shifted 612 and not shifted 610 ADC transfer curves. The solid and dashed portions 604 and 602 of FIG. 6A may correspond to the transfer function of FIG. 6C indicated by 610. The solid portion and dashed portions 606 and 608 of FIG. 6B may correspond to the transfer function of FIG. 6C indicated by 612.

Figure 7:
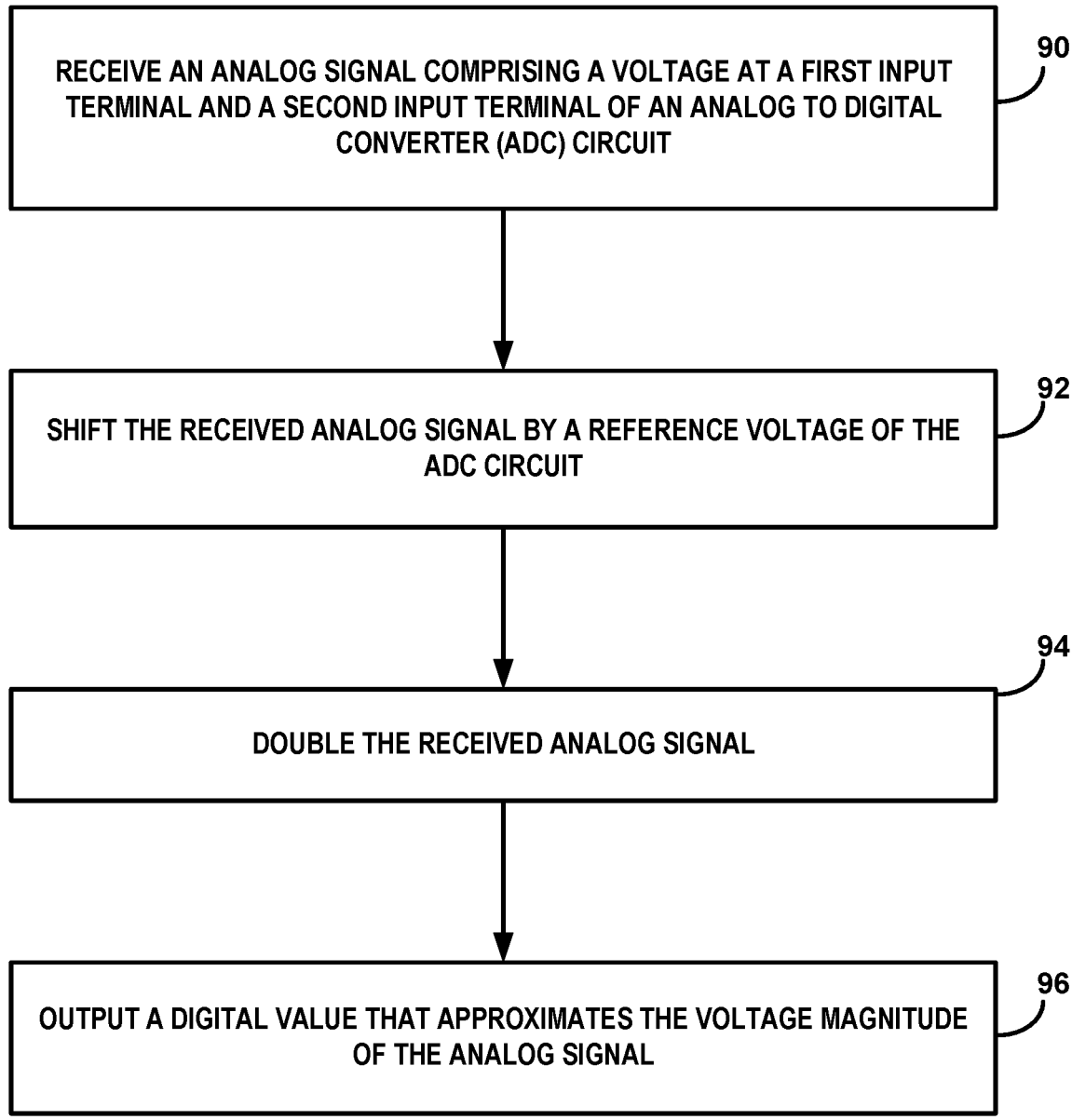
FIG. 7 is a flowchart describing an example operation for the TD ADC circuitry of this disclosure.

FIG. 7 is a flowchart describing an example operation for the TD ADC circuitry of this disclosure. The steps depicted by the blocks of FIG. 7 will be described in terms of FIG. 4, unless otherwise noted.

In the example of FIG. 7, the TD ADC circuit of FIG. 4 may receive an analog signal comprising a voltage at a first input terminal and a second input terminal (90). In the example of FIG. 4, the analog signal is a SE signal with Vinp_ai 438 at the first input terminal and a circuit ground, e.g., a reference voltage, at the second input terminal.

As shown in FIG. 3, the TD ADC circuit may shift the received analog signal by a reference voltage of the ADC circuit (92). The reference voltage for the ADC circuit, e.g., the voltage used by the ADC to compare to its analog input, Varef described above in relation to FIGS. 2 and 3 is a different reference voltage than the circuit ground voltage connected to the second input terminal. The TD ADC circuit may further double the received analog signal (94), which may be achieved by any of several implementations, as described above, e.g., the value of the sampling capacitors Cs1 435 and Cs2 436 being double the capacitance of the CDAC capacitors, Cd1 431 and Cd2 434, or by adjusting the value of Varef. The TD ADC may execute the successive approximation register search routine to determine and output a digital value that approximates the voltage magnitude of the analog signal received at the input terminals (96). The techniques of this disclosure may also be described in the following clauses.

Clause 1. An ADC circuit, the circuit comprising: a first input terminal and a second input terminal; and circuitry configured to: receive an analog signal comprising a voltage at the first input terminal and the second input terminal; shift the received analog signal by a reference voltage of the ADC circuit; double the received analog signal; and based on the shifted and doubled received analog signal, output a digital value that approximates the voltage of the analog signal.

Clause 2. The circuit of clause 1, further comprising a switched capacitor circuit connected to the first input terminal and the second input terminal, wherein the switched capacitor circuit comprises sampling capacitors and capacitive digital to analog converter (CDAC) capacitors, and wherein to double the received analog signal, a capacitance of the sampling capacitors is double a capacitance of the CDAC capacitors.

Clause 3. The circuit of clauses 1 or 2, further comprising a successive approximation register (SAR) that includes a positive SAR output terminal (sar_p) and a negative SAR output terminal (sar_n), wherein to shift the analog signal by the reference voltage of the ADC circuit, the circuitry is configured to set sar_p and sar_n to a value between zero and a full scale (FS) digital value of the ADC circuit.

Clause 4. The circuit of any of clauses 1-3, further comprising a successive approximation register (SAR) that includes a positive SAR output terminal (sar_p) and a negative SAR output terminal (sar_n), wherein to shift the analog signal by the reference voltage of the ADC circuit, the circuitry is configured to: set sar_p to digital zero; and set sar_n to the full scale (FS) value of the ADC circuit.

Clause 5. The circuit any of clauses 1-4, wherein the circuitry is configured to shift the analog signal by the reference voltage of the ADC circuit during a sampling phase.

Clause 6. The circuit any of clauses 1-5, wherein during the sampling phase, the circuitry is configured to sample the received analog signal against a common mode voltage of the analog signal.

Clause 7. The circuit any of clauses 1-6, further comprising a comparator that includes a non-inverting input terminal and an inverting input terminal, wherein the SAR is configured to receive an output of the comparator.

Clause 8. The circuit any of clauses 1-7, wherein: a first CDAC connects to the non-inverting input terminal through a first CDAC capacitor of the CDAC capacitors, the first CDAC configured to receive a digital output from sar_p; and a second CDAC connects to the non-inverting input terminal through a second CDAC capacitor of the CDAC capacitors, the second CDAC configured to receive a digital output from sar_n.

Clause 9. The circuit any of clauses 1-8, wherein during a hold and conversion phase the circuit is configured to: reset sar_p and sar_n to midscale, and execute the SAR algorithm through each of the first CDAC, and the second CDAC based on the output of the comparator at each decision cycle.

Clause 10. The circuit any of clauses 1-9, wherein the circuit is configured to convert either the received analog signal that is a differential analog signal or is a single-ended analog signal.

Clause 11. A method comprising: receiving an analog signal comprising a voltage magnitude at a first input terminal and a second input terminal of an ADC circuit; shifting the received analog signal by a reference voltage of the ADC circuit; doubling the received analog signal; and outputting a digital value that approximates the voltage magnitude of the analog signal.

Clause 12. The method of clause 11, wherein the ADC circuit comprises a switched capacitor circuit connected to the first input terminal and the second input terminal, wherein the switched capacitor circuit comprises sampling capacitors and capacitive digital to analog converter (CDAC) capacitors, and wherein doubling the received analog signal comprises sampling the received analog signal with the sampling capacitors, and wherein the capacitance of the sampling capacitors is double a capacitance of the CDAC capacitors.

Clause 13. The method of clauses 11 or 12, wherein the ADC circuit comprises a successive approximation register (SAR) that includes a positive SAR output terminal (sar_p) and a negative SAR output terminal (sar_n), wherein to shifting the analog signal by the reference voltage of the ADC circuit, comprises: setting sar_p to a digital zero; and setting sar_n to a full scale (FS) value of the ADC circuit.

Clause 14. The method any of clauses 11-13, the method further comprising shifting the analog signal by the reference voltage of the ADC circuit during a sampling phase.

Clause 15. The method any of clauses 11-14, further comprising, during the sampling phase, sampling the received analog signal against a common mode voltage of the analog signal.

Clause 16. The method any of clauses 11-15, wherein the ADC circuit further comprises a comparator that includes a non-inverting input terminal and an inverting input terminal, the method further comprising receiving, by the SAR, an output of the comparator.

Clause 17. The method any of clauses 11-16, wherein the ADC circuit further comprises: a first CDAC connected to the non-inverting input terminal through a first CDAC capacitor of the CDAC capacitors, the method further comprising receiving, by the first CDAC a digital output from sar_p; and a second CDAC connected to the non-inverting input terminal through a second CDAC capacitor of the CDAC capacitors, the method further comprising receiving, by the second CDAC a digital output from sar_n.

Clause 18. The method any of clauses 11-17, the method further comprising, during a hold and conversion phase: resetting sar_p and sar_n to midscale, and executing the SAR algorithm through each of the first CDAC, and second CDAC, based on the output of the comparator at each decision cycle.

Clause 19. The method any of clauses 11-18, wherein the received analog signal comprises a differential analog signal or a single-ended analog signal.

Clause 20. An ADC circuit, the circuit comprising: a first input terminal and a second input terminal; and circuitry configured to: receive an analog signal comprising a voltage magnitude at the first input terminal and the second input terminal; in response to the received analog signal being a single-ended analog signal, sampling the received analog signal and shift the received analog signal by a reference voltage of the ADC circuit; double the received analog signal by halving the reference voltage during the conversion phase and output a digital value that approximates the voltage magnitude of the analog signal.

In one or more examples, the functions described above may be implemented in hardware, software, firmware, or any combination thereof. For example, the various components of FIGS. 4, 5A and 5B may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described.

Various examples of the disclosure have been described. These and other examples are within the scope of the following claims.

What is claimed is:

1. An analog to digital converter (ADC) circuit, the circuit comprising:
a first input terminal and a second input terminal; and
circuitry configured to:
receive an analog signal comprising a voltage at the first input terminal and the second input terminal;
shift the received analog signal by a reference voltage of the ADC circuit;
double the received analog signal; and
based on the shifted and doubled received analog signal, output a digital value that approximates the voltage of the analog signal.

2. The circuit of claim 1, further comprising a switched capacitor circuit connected to the first input terminal and the second input terminal,
wherein the switched capacitor circuit comprises sampling capacitors and CDAC capacitors, and
wherein to double the received analog signal, a capacitance of the sampling capacitors is double a capacitance of the CDAC capacitors.

3. The circuit of claim 1, further comprising a successive approximation register (SAR) that includes a positive SAR output terminal (sar_p) and a negative SAR output terminal (sar_n), wherein to shift the analog signal by the reference voltage of the ADC circuit, the circuitry is configured to set sar_p and sar_n to a value between zero and a full scale (FS) digital value of the ADC circuit.

4. The circuit of claim 1, further comprising a successive approximation register (SAR) that includes a positive SAR output terminal (sar_p) and a negative SAR output terminal (sar_n), wherein to shift the analog signal by the reference voltage of the ADC circuit, the circuitry is configured to:
set sar_p to a digital zero; and
set sar_n to a full scale (FS) digital value of the ADC circuit.

5. The circuit of claim 4, wherein the circuitry is configured to shift the analog signal by the reference voltage of the ADC circuit during a sampling phase.

6. The circuit of claim 5, wherein during the sampling phase, the circuitry is configured to sample the received analog signal against a common mode voltage of the analog signal.

7. The circuit of claim 4, further comprising a comparator that includes a non-inverting input terminal and an inverting input terminal, wherein the SAR is configured to receive an output of the comparator.

8. The circuit of claim 7, wherein:
a first CDAC connects to the non-inverting input terminal through a first CDAC capacitor of the CDAC capacitors, the first CDAC configured to receive a digital output from sar_p; and
a second CDAC connects to the non-inverting input terminal through a second CDAC capacitor of the CDAC capacitors, the second CDAC configured to receive a digital output from sar_n.

9. The circuit of claim 8, wherein during a hold and conversion phase the circuit is configured to:
reset sar_p and sar_n to midscale, and
execute a successive approximation register (SAR) algorithm through each of the first CDAC, and the second CDAC based on the output of the comparator at each decision cycle.

10. The circuit of claim 1, wherein the circuit is configured to convert either the received analog signal that is a differential analog signal or is a single-ended analog signal.

11. A method comprising:
receiving an analog signal comprising a voltage magnitude at a first input terminal and a second input terminal of an ADC circuit;
shifting the received analog signal by a reference voltage of the ADC circuit;
doubling the received analog signal; and
outputting a digital value that approximates the voltage magnitude of the analog signal.

12. The method of claim 11,
wherein the ADC circuit comprises a switched capacitor circuit connected to the first input terminal and the second input terminal,
wherein the switched capacitor circuit comprises sampling capacitors and CDAC capacitors, and
wherein doubling the received analog signal comprises sampling the received analog signal with the sampling capacitors, and
wherein the capacitance of the sampling capacitors is double a capacitance of the CDAC capacitors.

13. The method of claim 11,
wherein the ADC circuit comprises a successive approximation register (SAR) that includes a positive SAR output terminal (sar_p) and a negative SAR output terminal (sar_n),
wherein to shifting the analog signal by the reference voltage of the ADC circuit, comprises:
setting sar_p to a digital zero; and
setting sar_n to a full scale (FS) value of the ADC circuit.

14. The method of claim 13, the method further comprising shifting the analog signal by the reference voltage of the ADC circuit during a sampling phase.

15. The method of claim 14, further comprising, during the sampling phase, sampling the received analog signal against a common mode voltage of the analog signal.

16. The method of claim 13,
wherein the ADC circuit further comprises a comparator that includes a non-inverting input terminal and an inverting input terminal,
the method further comprising receiving, by the SAR, an output of the comparator.

17. The method of claim 16, wherein the ADC circuit further comprises:
a first CDAC connected to the non-inverting input terminal through a first CDAC capacitor of the CDAC capacitors, the method further comprising receiving, by the first CDAC a digital output from sar_p; and
a second CDAC connected to the non-inverting input terminal through a second CDAC capacitor of the CDAC capacitors, the method further comprising receiving, by the second CDAC a digital output from sar_n.

18. The method of claim 17, the method further comprising, during a hold and conversion phase:
resetting sar_p and sar_n to zero, and
executing a successive approximation register (SAR) algorithm through each of the first CDAC, and second CDAC, based on the output of the comparator at each decision cycle.

19. The method of claim 11, wherein the received analog signal comprises a differential analog signal or a single-ended analog signal.

20. An analog-to-digital conversion (ADC) circuit, the circuit comprising:
a first input terminal and a second input terminal; and
circuitry configured to:
receive an analog signal comprising a voltage magnitude at the first input terminal and the second input terminal;
in response to the received analog signal being a single-ended analog signal, sample the received analog signal and shift the received analog signal by a reference voltage of the ADC circuit;
double the received analog signal by halving the reference voltage during a conversion phase; and
output a digital value that approximates the voltage magnitude of the analog signal.

* * * * *